US012354904B2

United States Patent
Ali et al.

(10) Patent No.: US 12,354,904 B2
(45) Date of Patent: Jul. 8, 2025

(54) METHOD OF REDUCING INTEGRATED DEEP TRENCH OPTICALLY SENSITIVE DEFECTIVITY

(71) Applicant: Texas Instruments Incorporated, Dallas, TX (US)

(72) Inventors: Abbas Ali, Plano, TX (US); Scott Hiemke, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 247 days.

(21) Appl. No.: 17/512,534

(22) Filed: Oct. 27, 2021

(65) Prior Publication Data

US 2023/0126899 A1  Apr. 27, 2023

(51) Int. Cl.
| | |
|---|---|
| H01L 21/74 | (2006.01) |
| H01L 21/762 | (2006.01) |
| H01L 23/58 | (2006.01) |
| H10D 1/00 | (2025.01) |
| H10D 1/66 | (2025.01) |
| H10D 1/68 | (2025.01) |

(52) U.S. Cl.
CPC ........ *H01L 21/74* (2013.01); *H01L 21/76224* (2013.01); *H01L 23/585* (2013.01); *H10D 1/692* (2025.01)

(58) Field of Classification Search
CPC . H01L 21/74; H01L 21/76224; H01L 23/585; H01L 28/60; H01L 21/76232; H01L 21/76229; H01L 21/3081; H01L 29/407; H01L 29/0649; H01L 21/02269; H10D 1/047; H10D 1/665
See application file for complete search history.

(56) References Cited

U.S. PATENT DOCUMENTS

| | | | | |
|---|---|---|---|---|
| 8,841,174 | B1* | 9/2014 | Di Sarro | H01L 27/1203 257/173 |
| 9,252,080 | B1* | 2/2016 | Couture | H01L 23/481 |
| 2003/0017675 | A1* | 1/2003 | Chen | H10B 12/0385 257/E21.653 |
| 2004/0203203 | A1* | 10/2004 | Hsu | H01L 29/66181 257/E21.396 |

(Continued)

OTHER PUBLICATIONS

Surface Oxidation of Silicon Nitride Films, 1976 ECS—The Electrochemical Society, Raider (Year: 1976).*

Primary Examiner — Antonio B Crite
(74) Attorney, Agent, or Firm — Yudong Kim; Frank D. Cimino

(57) ABSTRACT

A microelectronic device includes an integrated deep trench in a substrate, with a field oxide layer on the substrate. The integrated deep trench includes a of deep trench extending into semiconductor material of the substrate, a deep trench sidewall dielectric layer contacting the substrate and an electrically conductive trench-fill material contacting the deep trench sidewall dielectric layer. The conductive trench-fill material is covered during the formation of the field oxide layer to minimize the trench-fill seam void volume. Minimizing the trench-fill seam void volume minimizes optical defectivity observed in subsequent yield enhancement. The integrated deep trench may be configured as a capacitor or may be configured as a contact to the underlying substrate.

27 Claims, 15 Drawing Sheets

(56) References Cited

U.S. PATENT DOCUMENTS

| | | | |
|---|---|---|---|
| 2007/0181975 A1* | 8/2007 | Koops | H01L 29/407 257/559 |
| 2009/0128180 A1* | 5/2009 | Kim | G01R 3/00 216/11 |
| 2009/0302421 A1* | 12/2009 | Sardana | H01L 29/66181 257/532 |
| 2012/0061639 A1* | 3/2012 | Yasuda | H10B 63/20 257/E45.001 |
| 2012/0126338 A1* | 5/2012 | Juengling | H10B 12/056 438/587 |
| 2016/0079417 A1* | 3/2016 | Iguchi | H01L 29/7823 257/344 |
| 2019/0051721 A1* | 2/2019 | Hu | H01L 21/30625 |
| 2019/0109039 A1* | 4/2019 | Dong | H01L 29/7816 |
| 2019/0259651 A1* | 8/2019 | Lillibridge | H01L 21/76232 |

\* cited by examiner

METHOD OF REDUCING INTEGRATED DEEP TRENCH OPTICALLY SENSITIVE DEFECTIVITY

FIELD

This disclosure relates to the field of microelectronic devices. More particularly, but not exclusively, this disclosure relates to integrated deep trench components in microelectronic devices.

BACKGROUND

Integrated deep trench components have been formed in microelectronic devices such as capacitors and contacts to buried layers. Some methods of forming integrated deep trenches may subsequently cause defectivity at later processing steps. Improvements in integrating deep trench components into microelectronic devices are needed.

SUMMARY

The present disclosure introduces a microelectronic device including an integrated deep trench in a substrate of the microelectronic device. The microelectronic device has a field oxide layer on the substrate. The integrated deep trench may be configured to function as a capacitor or as a contact to a buried layer. A deep trench sidewall dielectric contacts the silicon of the substrate and may be a single layer of dielectric material, or a multi-layer stack of dielectric materials. The dielectric material of the deep trench sidewall dielectric at the bottom of the deep trench may be continuous in the case of a capacitor, or may be removed at the bottom of the deep trench in the case of a contact to a buried layer. The integrated deep trench further includes an electrically conductive trench-fill material on the deep trench sidewall dielectric layer of the deep trench. The trench-fill material has a central seam. The microelectronic device includes a protective layer over the central seam, which covers the complete seam.

DETAILED DESCRIPTION

Figure 1A:
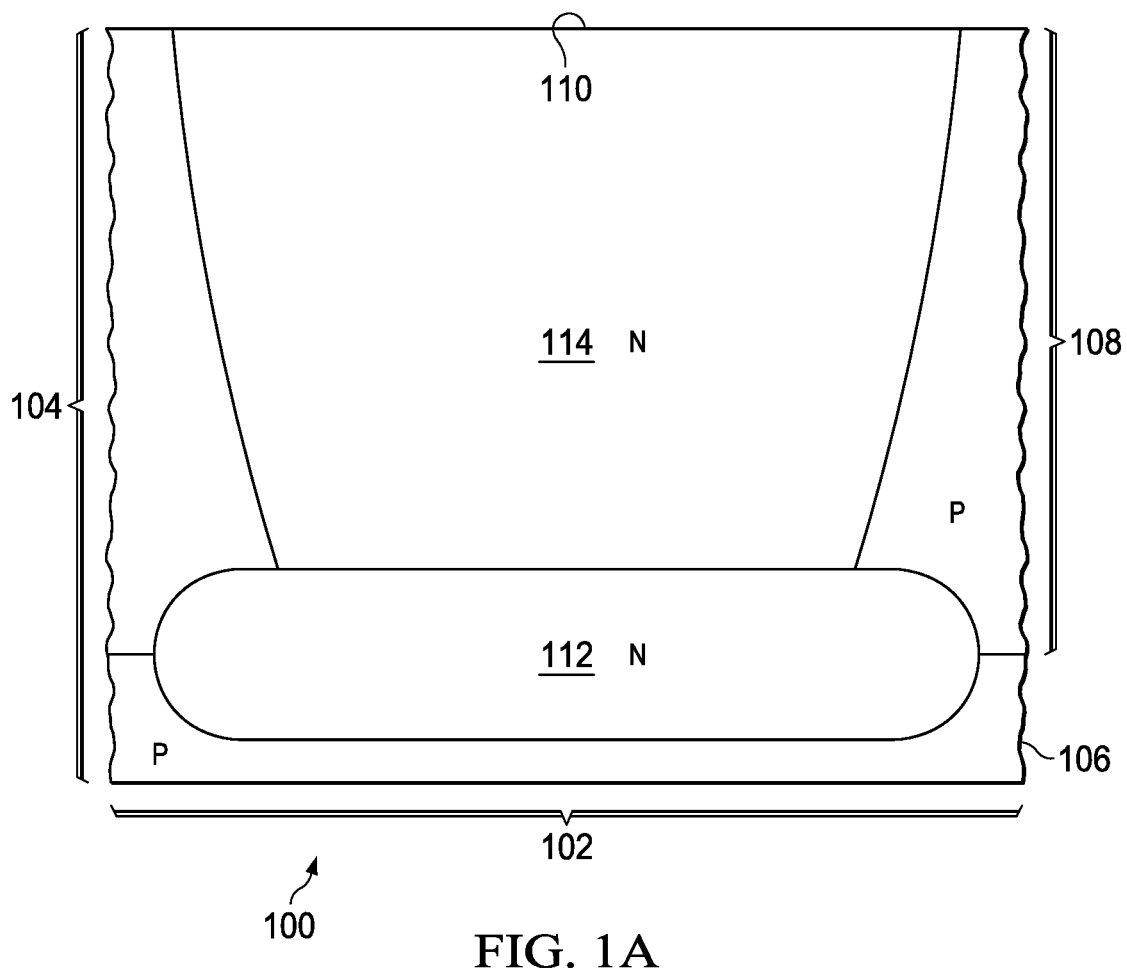
FIG. 1A through FIG. 1K are cross sections of an example microelectronic device with an integrated deep trench, depicted in successive stages of an example method of formation.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

It is noted that terms such as top, bottom, front, back, over, above, under, and below may be used in this disclosure. These terms should not be construed as limiting the position or orientation of a structure or element, but should be used to provide spatial relationship between structures or elements. Similarly, words such as "inward" and "outward" would refer to directions toward and away from, respectively, the geometric center of a device or area and designated parts thereof.

For the purposes of this disclosure, the term "lateral" refers to a direction parallel to a plane of the instant top surface of the microelectronic device the term "vertical" is understood to refer to a direction perpendicular to the plane of the instant top surface of the microelectronic device.

For the purposes of this disclosure, the term "conductive" is understood to mean "electrically conductive".

A microelectronic device is formed in and on a substrate having a semiconductor material. The microelectronic device includes a deep trench in the substrate extending into the semiconductor material. For the purposes of this disclosure a deep trench is defined as a trench in the semiconductor material which is deeper than a field oxide trench. The deep trench also includes a deep trench sidewall dielectric layer in each deep trench, contacting the semiconductor material. The deep trench further includes an electrically conductive trench-fill material on the deep trench sidewall dielectric layer in each deep trench.

The microelectronic device has a field oxide layer on the semiconductor material. The trench fill seam of the electrically conductive trench-fill material is covered by a protective layer during the formation of the field oxide layer. It is advantageous to cover the trench-fill seam of the electrically conductive trench fill material to minimize conductive trench-fill seam void volume which may result in optical defects during subsequent yield enhancement inspections. Additionally, it is advantageous when the deep trench forms a continuous ring, the protective layer of the central seam of the electrically conductive trench-fill material forms a continuous ring to protect the trench-fill seam of the electrically conductive trench-fill material and minimize trench-fill seam void volume for both in linear segments and corner segments. In other words, the trench-fill seam is free of field oxide above the trench-fill seam.

The field oxide layer also covers a portion of the trench-fill material in each of the deep trenches, with a trench contact opening over the electrically conductive trench-fill material in each deep trench. The trench-fill material extends through each trench contact opening. A metal silicide layer is located on the trench-fill material in each trench contact opening. A silicide-blocking layer is located over the field oxide layer, overlapping the deep trench sidewall dielectric layer. The silicide-blocking layer is free of the metal silicide layer. The microelectronic device is free of the metal silicide layer between the deep trenches. The integrated deep trench includes a trench contact opening area over the electrically conductive trench-fill material and a substrate contact opening to the semiconductor material.

FIG. 1A through FIG. 1I are cross sections of an example microelectronic device 100 with an integrated deep trench 102, depicted in successive stages of an example method of formation. Referring to FIG. 1A, the microelectronic device 100 is formed in and on a substrate 104. In this example, the substrate 104 may include a base wafer 106, such as a silicon wafer. The base wafer 106 may have a first conductivity type, which may be p-type in this example. In an alternate version of this example, the base wafer 106 may include a dielectric material, such as silicon dioxide or sapphire, to provide a silicon-on-insulator substrate. The substrate 104 of this example also includes a semiconductor material 108 formed on the base wafer 106. The semiconductor material 108 includes primarily silicon, and may consist essentially of silicon and dopants, such as boron. The semiconductor material 108 may be formed as an epitaxial layer. The semiconductor material 108 extends to a top surface 110 of the substrate 104, located on an opposite surface of the semiconductor material 108 from a boundary between the semiconductor material 108 and the base wafer 106. In this example, the semiconductor material 108 may have the first conductivity type, that is, p-type. The semiconductor material 108 may be 5 microns to 15 microns thick, by way of example.

A buried layer 112 may be formed in the substrate 104, extending into both the base wafer 106 and the semiconductor material 108. The buried layer 112 has a second conductivity type, opposite from the first conductivity type. In this example, the second conductivity type is n-type. The buried layer 112 may be formed by implanting dopants of the second conductivity type, such as phosphorus, arsenic, or antimony, into the base wafer 106 before the semiconductor material 108 is formed. The buried layer 112 may have an average dopant density greater than twice an average dopant density of the semiconductor material 108 between the buried layer 112 and the top surface of the substrate. The base wafer 106 may be annealed prior to forming the semiconductor material 108, and the semiconductor material 108 may subsequently be formed by an epitaxial process of thermal decomposition of silane, during which the dopants of the second conductivity type diffuse deeper into the base wafer 106 and into the semiconductor material 108, forming the buried layer 112.

A deep well 114 may be formed in the semiconductor material 108, extending from the top surface 110 of the substrate 104 to the buried layer 112. The deep well 114 may have the second conductivity type, n-type in this example. The deep well 114 may be formed by implanting dopants of the second conductivity type, such as phosphorus, into the semiconductor material 108, followed by a thermal drive to diffuse the implanted dopants to the buried layer 112 and activate the implanted dopants. The deep well 114 may have an average concentration of the dopants of the second conductivity type that is 2 to 10 times greater than an average concentration of dopants of the first conductivity type in the semiconductor material 108 outside of the deep well 114.

In another version of this example, the deep well 114 may have the first conductivity type, and may have an average concentration of the dopants of the first conductivity type that is 2 to 10 times greater than an average concentration of dopants of the first conductivity type in the semiconductor material 108 outside of the deep well 114. In a further version, the buried layer 112 may be omitted. In yet another version, both the deep well 114 and the buried layer 112 may be omitted.

Figure 1B:
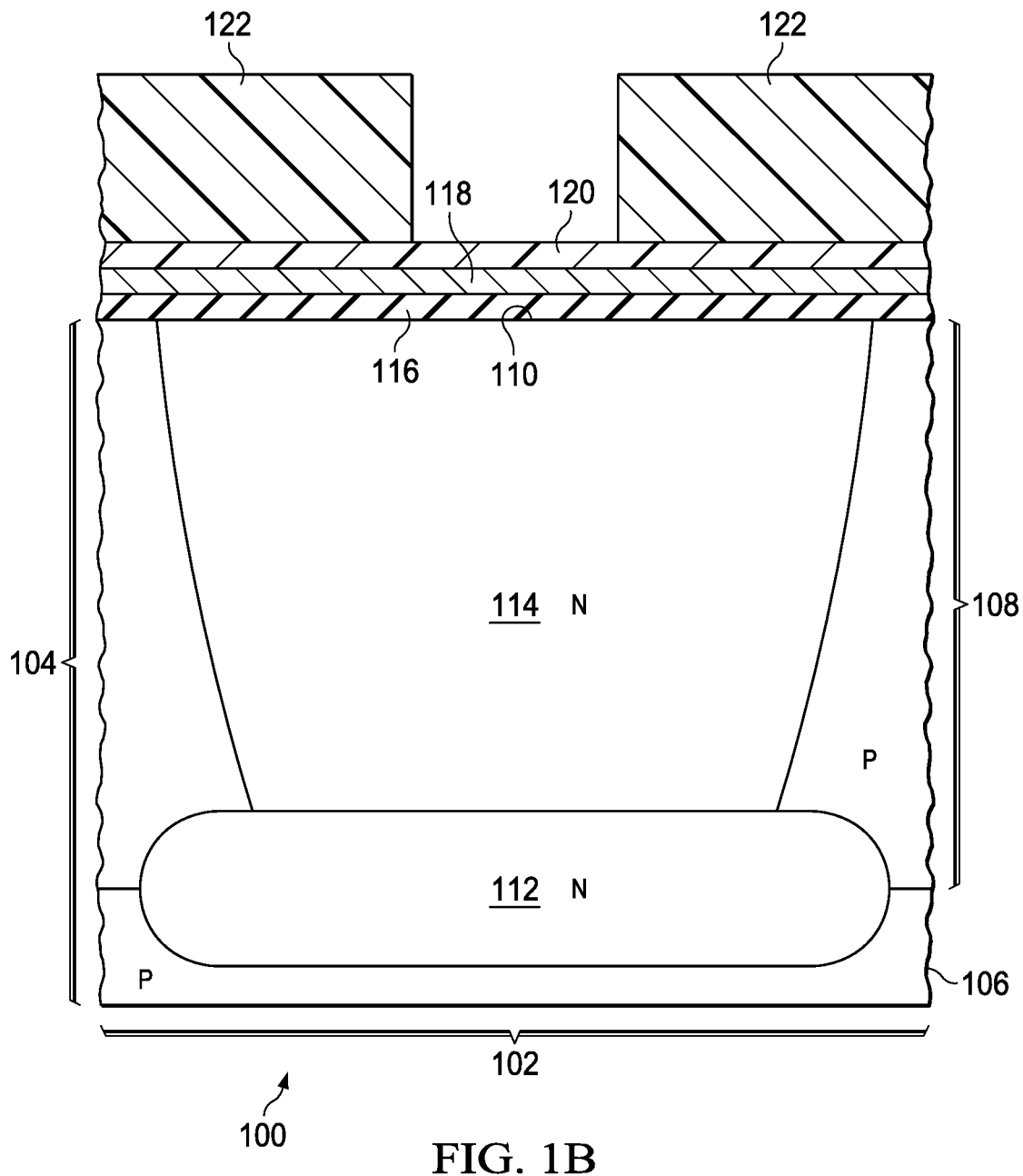

Referring to FIG. 1B, a pad oxide layer 116 may be formed on the top surface 110 of the substrate 104. The pad oxide layer 116 may include primarily silicon dioxide, may be formed by a thermal oxidation process or a thermal chemical vapor deposition (CVD) process, and may have a thickness of 50 nanometers to 200 nanometers, by way of example. A nitride cap layer 118 may be formed on the pad oxide layer 116. The nitride cap layer 118 may include primarily silicon nitride, may be formed by a low pressure chemical vapor deposition (LPCVD) furnace process, and may have a thickness of 100 nanometers to 500 nanometers, for example. A hard mask layer 120 may be formed on the nitride cap layer 118. The hard mask layer 120 may include primarily silicon dioxide, may be formed by a plasma enhanced chemical vapor deposition (PECVD) process, and may have a thickness of 1 micron to 3 microns, depending on a depth of subsequently-formed deep trench 126, shown in FIG. 1C. The pad oxide layer 116 may provide stress relief between the semiconductor material 108 and a combination of the nitride cap layer 118 and the hard mask layer 120. The nitride cap layer 118 may provide a stop layer for subsequent etch and planarization processes. The hard mask layer 120 may provide a hard mask during a subsequent deep trench etch process 124 to form the deep trench 126. Next, a trench mask 122 may be formed on the hard mask layer 120 with openings which expose the hard mask layer 120 in an area for the deep trench 126. The trench mask 122 may include photoresist, and may optionally include anti-reflection material such as a bottom anti-reflection coat (BARC). The trench mask 122 may be formed by a photolithographic process.

Figure 1C:
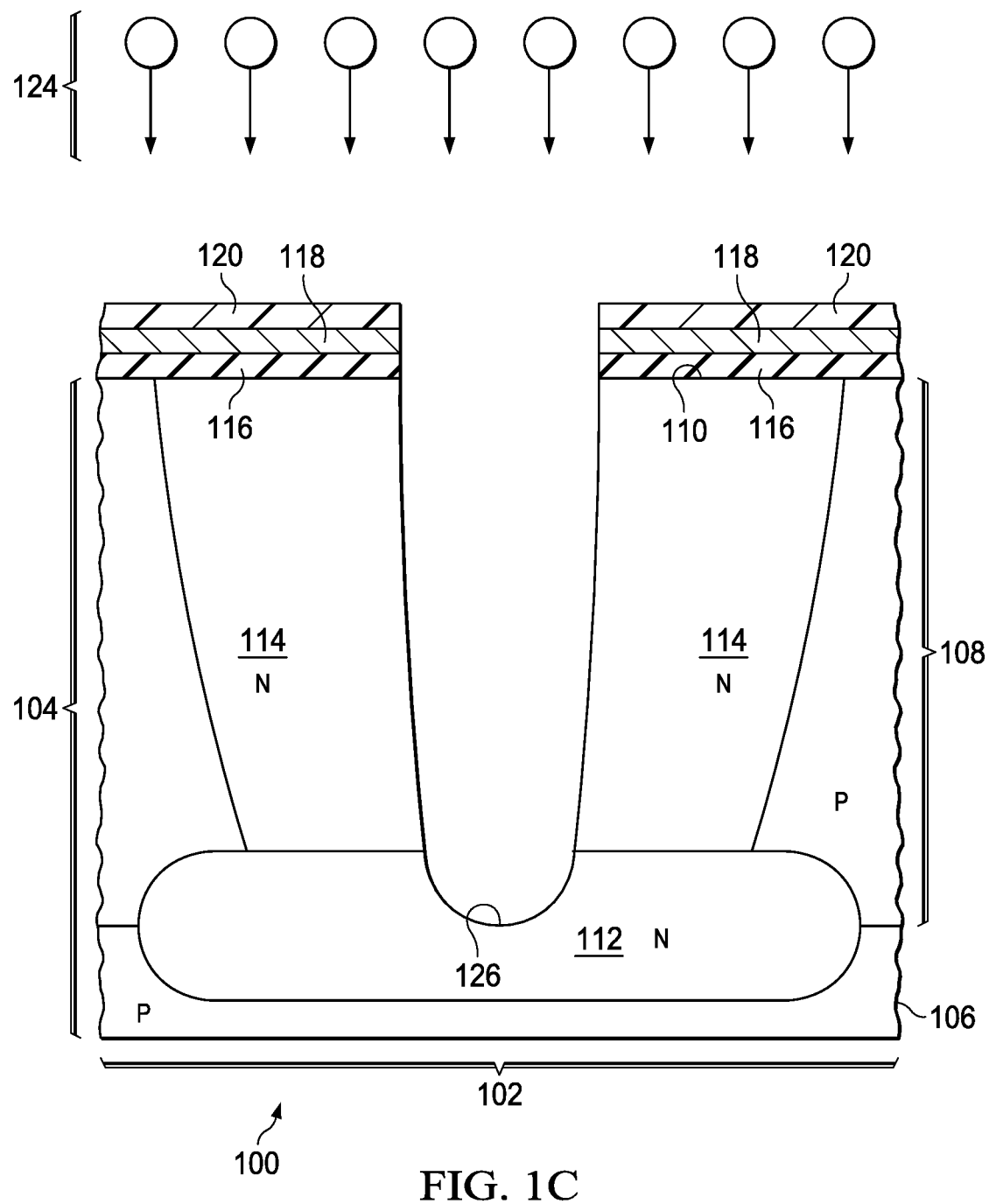

Referring to FIG. 1C, a deep trench etch process 124 is performed to form the deep trench 126 in the semiconductor material 108. The deep trench etch process 124 may include multiple steps. In one implementation for example, a hard mask etch may be first performed to remove the hard mask layer 120 where exposed by the trench mask 122 of FIG. 1B, and a silicon etch may then be performed to remove the nitride cap layer 118, the pad oxide layer 116, and the semiconductor material 108 in regions that are exposed by the hard mask layer 120 to form the deep trench 126. The deep trench 126 extends from the top surface 110 of the substrate 104 into the semiconductor material 108. The deep trench 126 may extend to the buried layer 112, as depicted in FIG. 1C, so that the buried layer 112 extends under the deep trench 126. In an alternate version of this example, the deep trench 126 may extend proximate to, but not contact, the buried layer 112. During the silicon etch, the trench mask 122 may also be partially or completely removed, leaving the hard mask layer 120 to prevent the area outside of the deep trench 126 from being etched. FIG. 1C depicts the deep trench etch process 124 at completion, and the trench mask 122 has been removed by the subsequent deep trench etch clean-up process (not specifically shown). The organic polymers in the trench mask 122 may be removed using an oxygen plasma, followed by a series of wet etch processes, including an aqueous mixture of sulfuring acid and hydrogen peroxide, an aqueous mixture of ammonium hydroxide and hydrogen peroxide, and an aqueous mixture of hydrochloric acid and hydrogen peroxide.

Figure 1D:
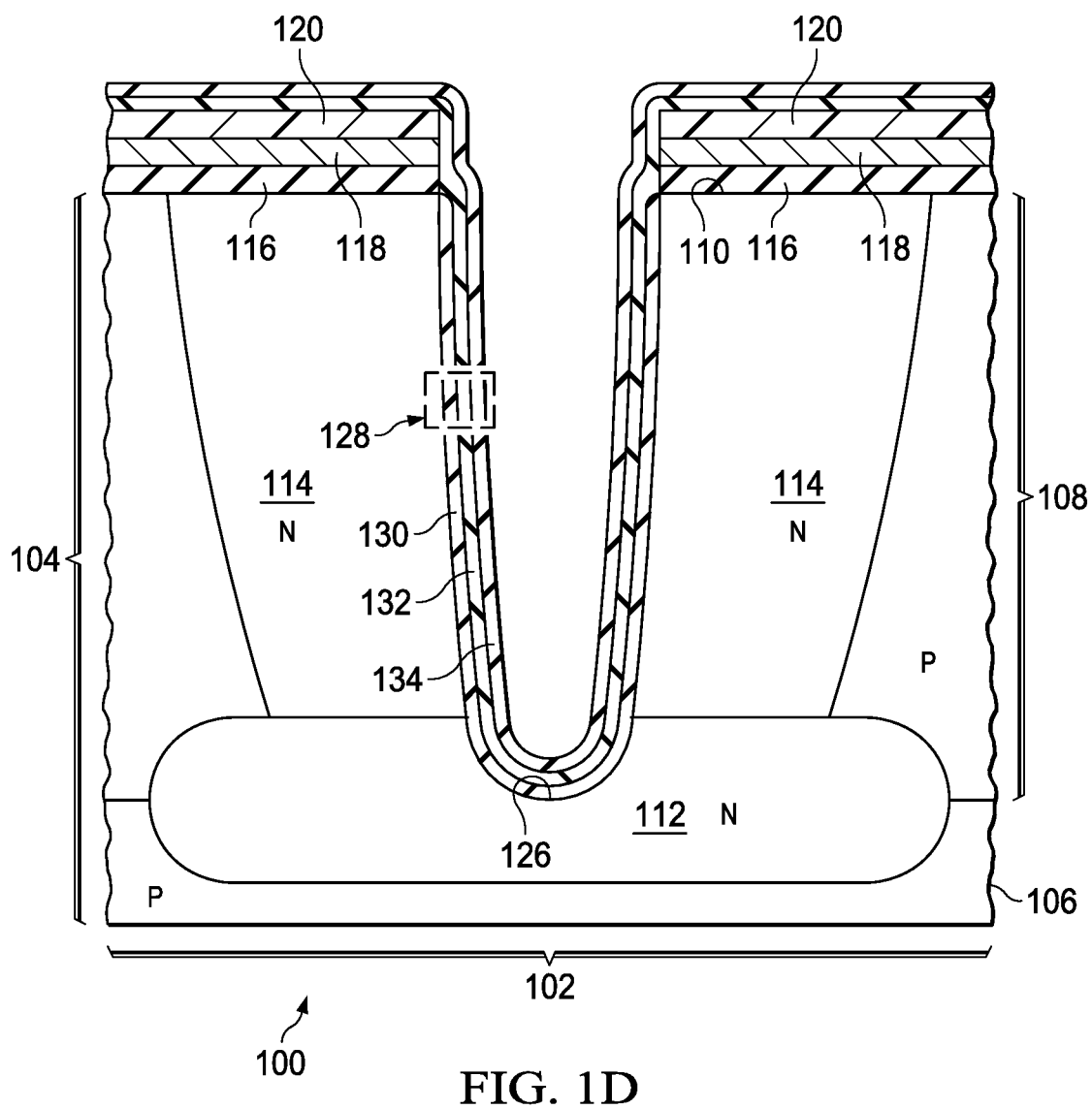

Referring to FIG. 1D, a deep trench sidewall dielectric layer 128 is formed in the deep trench 126, contacting the semiconductor material 108 of the substrate 104. The deep trench sidewall dielectric layer 128 may extend over the hard mask layer 120, the nitride cap layer 118, and the pad oxide layer 116. The deep trench sidewall dielectric layer 128 may include a single layer of a silicon-nitrogen compound or a silicon dioxide compound or may include multiple layers of silicon-nitrogen compounds, silicon dioxide compounds, or other dielectric materials. In this example, the deep trench sidewall dielectric layer 128 may include an outer layer 130 contacting the semiconductor material 108 of the substrate 104, a center layer 132 on the outer layer 130, and an inner layer 134 on the center layer 132.

The outer layer 130 may include silicon dioxide, and may be formed by a thermal oxidation process which oxidizes silicon in the substrate 104 at the deep trench 126. The outer layer 130 may not extend onto the hard mask layer 120, the nitride cap layer 118, and the pad oxide layer 116, as depicted in FIG. 1D, due to a lack of available silicon to be oxidized in these layers. The outer layer 130 may be at least 3 nanometers thick, to provide low leakage current in the integrated deep trench 102 during operation of the microelectronic device 100 when configured to function as a capacitor, and may be 6 nanometers to 10 nanometers thick, depending on an operating potential of the integrated deep trench 102.

The center layer 132 includes the silicon-nitrogen compound, consisting of silicon nitride or silicon oxynitride. The center layer 132 may be formed by a CVD process or an LPCVD process using a silicon-containing reagent gas, labeled "SILICON REAGENT" in FIG. 1D and a nitrogen-containing reagent gas, labeled "NITROGEN REAGENT" in FIG. 1D. The silicon-containing reagent gas may be implemented as silane or dichlorosilane. The nitrogen-containing reagent gas may be implemented as ammonia or hydrazine. Alternatively, the silicon-containing reagent gas and the nitrogen-containing reagent gas may be implemented as bis(tertiary-butyl-amino)silane (BTBAS). The thickness of the center layer 132 may be selected to provide a desired capacitance density and breakdown potential for the integrated deep trench 102. By way of example, the center layer 132 may be 12 nanometers thick to provide a breakdown potential greater than 12 volts. In other version of this example, the center layer 132 may be 8 nanometers to 40 nanometers thick. Having the silicon-nitrogen compound in the deep trench sidewall dielectric layer 128 may advantageously provide more reliability and higher operating potential compared to a dielectric layer without the silicon-nitrogen compound.

The inner layer 134 may include primarily silicon dioxide or silicon oxynitride, to reduce charge trapping in the deep trench sidewall dielectric layer 128 and to provide a suitable interface to a subsequently formed electrically conductive trench-fill material 136, shown in FIG. 1E. The inner layer 134 may be formed by a CVD process or an LPCVD process using the silicon-containing reagent gas, labeled "SILICON REAGENT" in FIG. 1D and an oxygen-containing reagent gas, labeled "OXYGEN REAGENT" in FIG. 1D, and optionally using the nitrogen-containing reagent gas, if nitrogen is needed to form the inner layer 134. The oxygen-containing reagent gas may be implemented as oxygen or nitrous oxide. Alternatively, the silicon-containing reagent gas and the oxygen-containing reagent gas may be implemented as tetraethoxysilane (TEOS), also referred to as tetraethyl orthosilicate. The inner layer 134 may have a thickness of 40 nanometers to 60 nanometers immediately after being formed. A trench dielectric etch process may be performed after the inner layer 134 is formed to improve thickness uniformity of the inner layer 134 along sidewalls of the deep trench 126 while maintaining a continuous sheath of deep trench sidewall dielectric layer 128 when the integrated deep trench 102 is configured to function as a capacitor. The trench dielectric etch may also be used to form an opening in the deep trench sidewall dielectric layer 128 to provide a conductive pathway between the subsequently formed electrically conductive trench-fill material 136 and the buried layer 112 as shown in FIG. 2 when the integrated deep trench 202 is used as a contact to the buried layer 112 or when the integrated deep trench 202 is used for isolating microelectronic components in the semiconductor material 108.

Figure 1E:
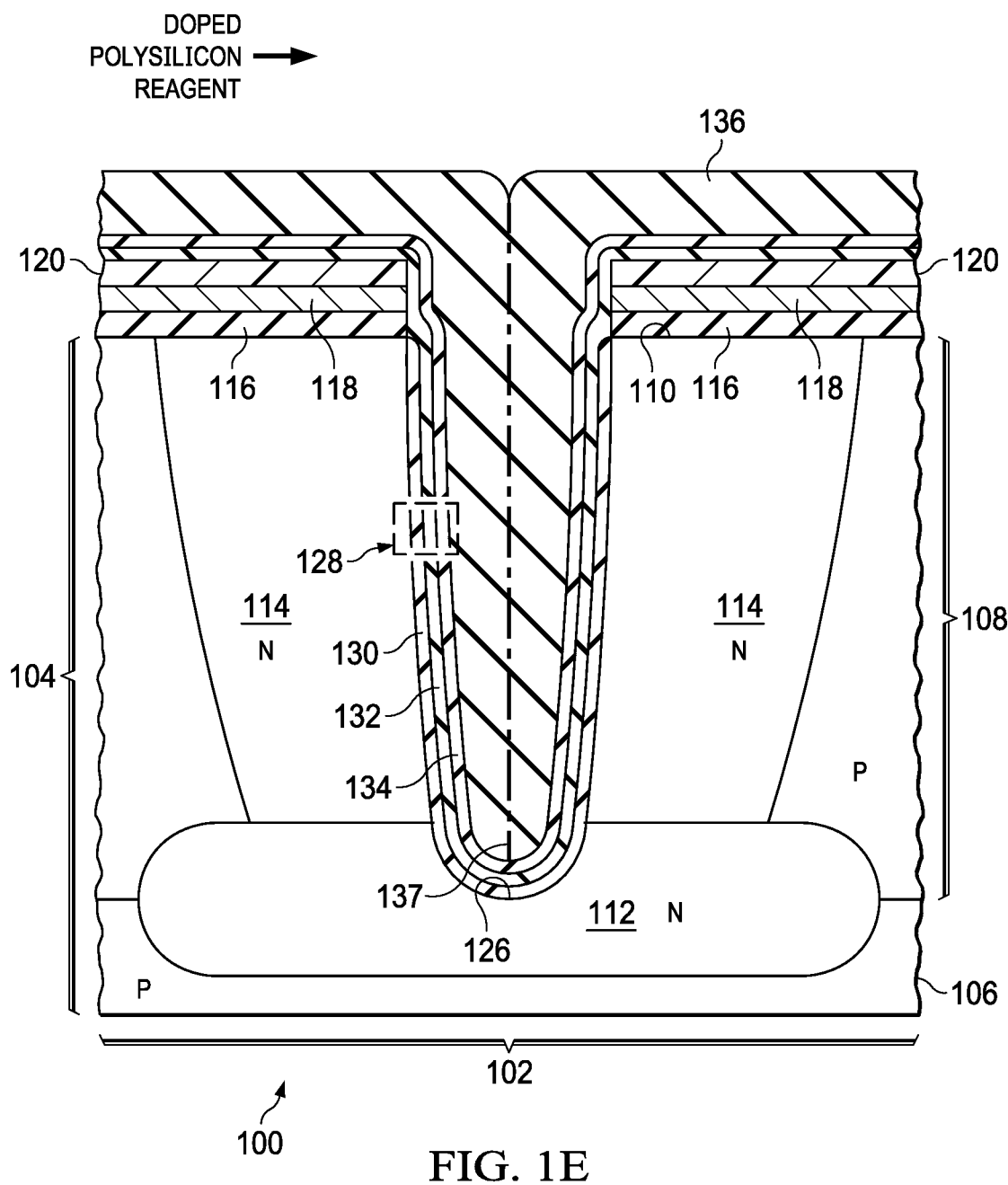
Figure 2:
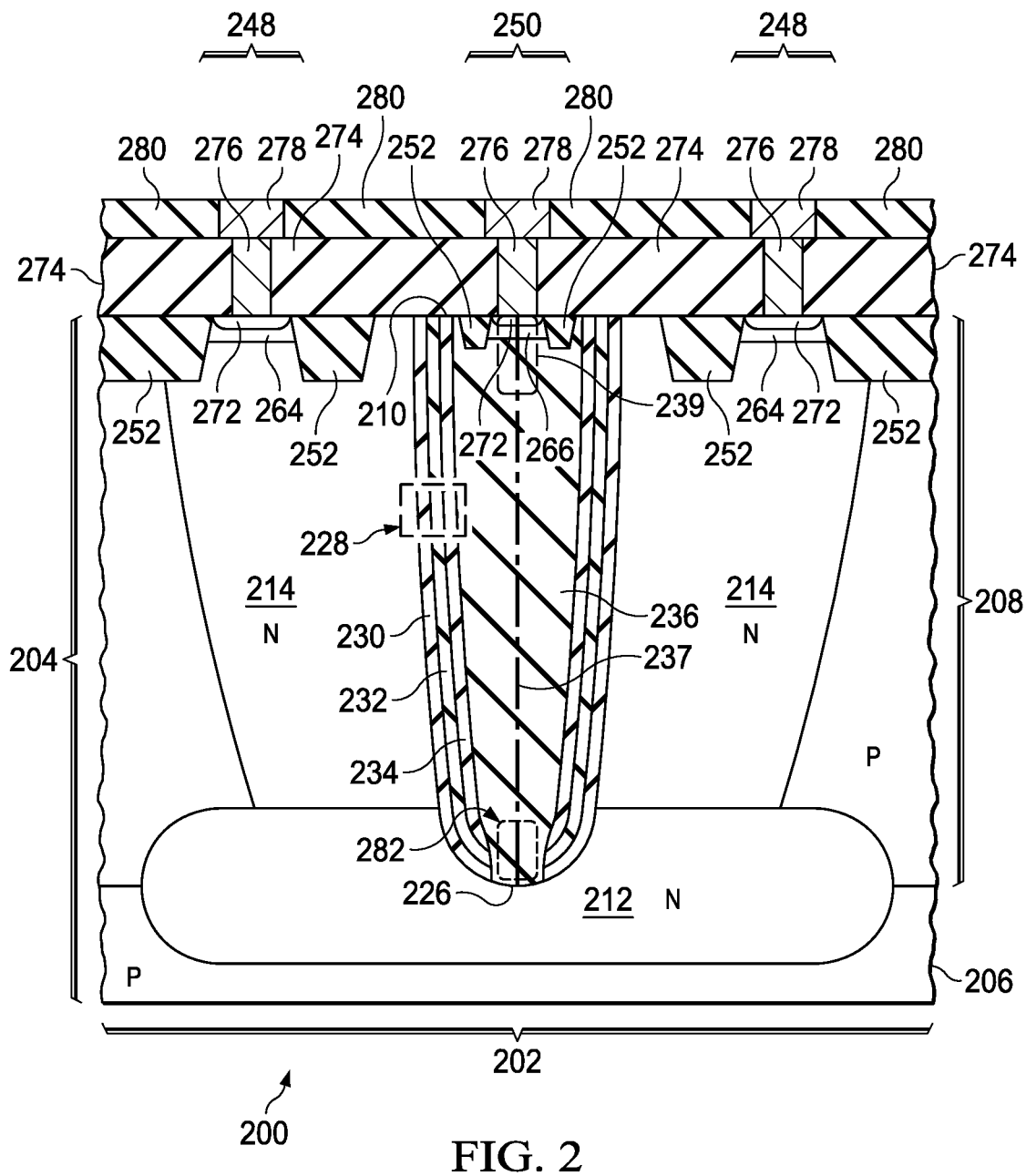
FIG. 2 discloses a cross-sectional view of a microelectronic device containing an integrated deep trench contacting an underlying buried layer.

Referring to FIG. 1E, an electrically conductive trench-fill material 136 is formed in the deep trench 126 on the deep trench sidewall dielectric layer 128. The electrically conductive trench-fill material 136 includes primarily silicon, and may be implemented as polycrystalline silicon, commonly referred to as polysilicon. Alternatively, the electrically conductive trench-fill material 136 may be implemented as amorphous silicon, or semi-amorphous silicon. The electrically conductive trench-fill material 136 may have the first conductivity type, p-type in this example. The electrically conductive trench-fill material 136 may have an average concentration of dopants of $5 \times 10^{18}$ cm$^{-3}$ and $1 \times 10^{20}$ cm$^{-3}$, to provide a low equivalent series resistance for the integrated deep trench 102.

The electrically conductive trench-fill material 136 may be formed by thermal decomposition of a silicon-containing reagent gas that includes dopants, labeled "DOPED POLYSILICON REAGENT" in FIG. 1E. The electrically conductive trench-fill material 136 fills the deep trench 126 and may extend over the substrate 104 outside of the deep trench 126, as depicted in FIG. 1E. The electrically conductive trench-fill material 136 may contain a trench-fill seam 137. The trench-fill seam 137 may be a source of optical defects if the trench-fill seam 137 develops a trench-fill seam void volume 139 shown in FIG. 1F at the top surface 110 of the semiconductor material 108 during subsequent processing.

Figure 1F:
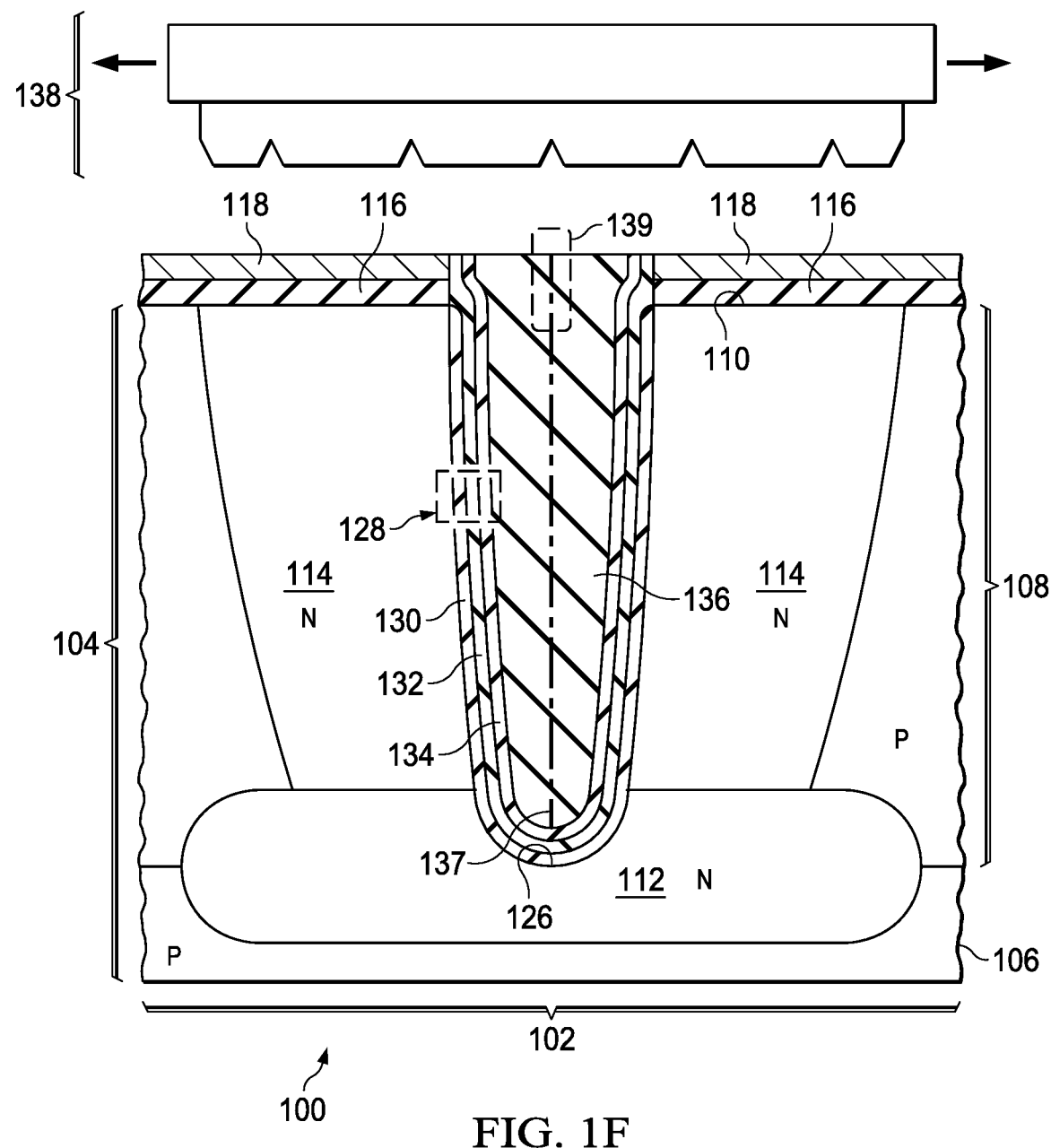

Referring to FIG. 1F, the electrically conductive trench-fill material 136 and the deep trench sidewall dielectric layer 128 are removed from outside of the deep trench 126. The electrically conductive trench-fill material 136 and the deep trench sidewall dielectric layer 128 may be removed by a planarization process, such as a chemical mechanical polish (CMP) process 138, as indicated in FIG. 1F. Alternatively, the electrically conductive trench-fill material 136 and the deep trench sidewall dielectric layer 128 may be removed by an etch back process. The process of removing the electrically conductive trench-fill material 136 and the deep trench sidewall dielectric layer 128 on the top surface 110 of the substrate 104 leaves the electrically conductive trench-fill material 136 on the deep trench sidewall dielectric layer 128 in the deep trench 126. The process of removing the electrically conductive trench-fill material 136 and the deep trench sidewall dielectric layer 128 may leave the nitride cap layer 118 and the pad oxide layer 116 on the top surface 110 of the substrate 104. The nitride cap layer 118 may provide a stop layer for the CMP process 154 or the etch back process. The nitride cap layer 118 and the pad oxide layer 116 may be removed in a separate process, after removing the electrically conductive trench-fill material 136 and the deep trench sidewall dielectric layer 128 from outside of the deep trench 126.

Figure 1G:
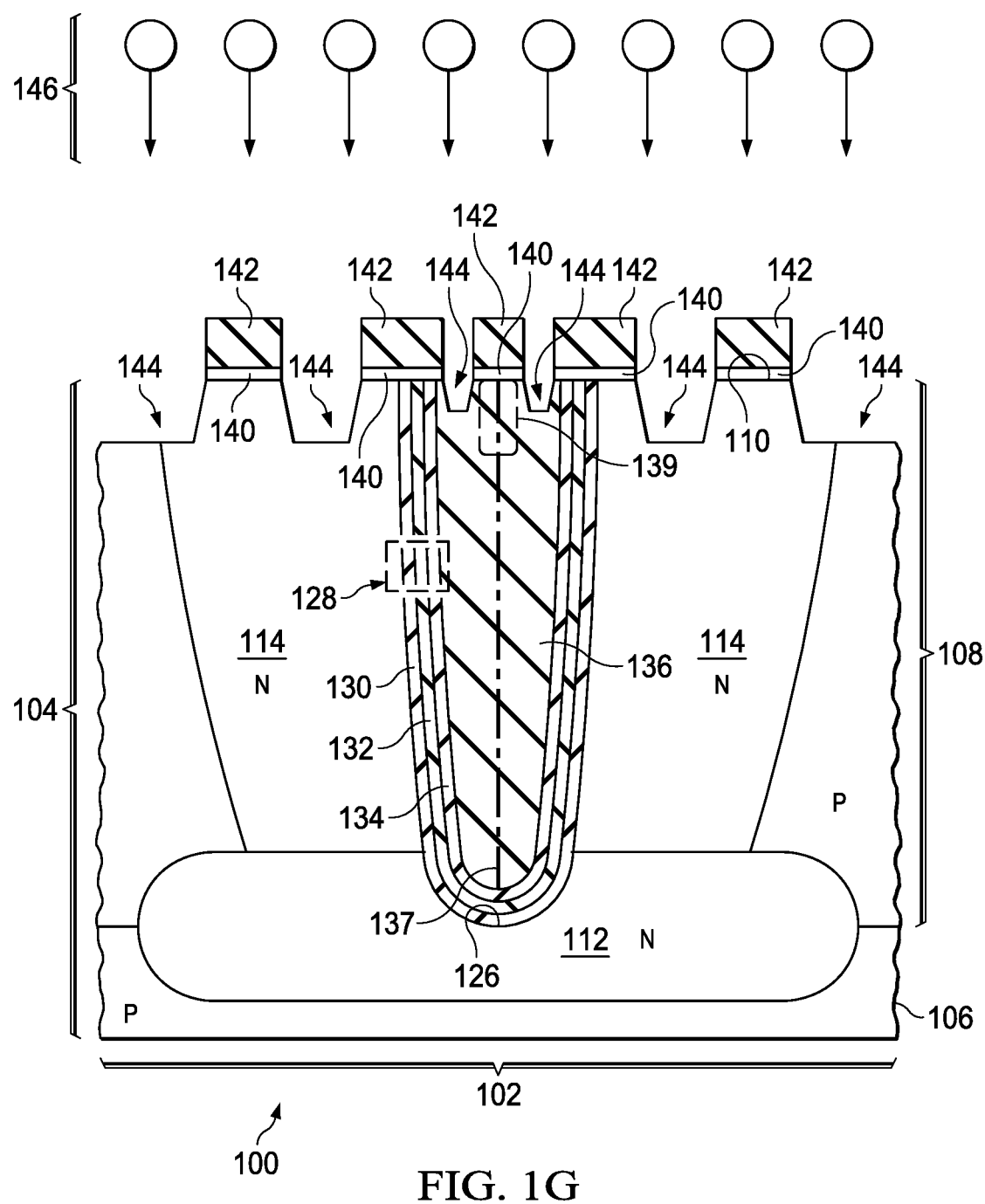

Referring to FIG. 1G, a CMP stop layer 140 may be formed over the top surface 110 of the substrate 104, the deep trench sidewall dielectric layer 128, and the electrically conductive trench-fill material 136. The CMP stop layer 140 provides a protective layer covering the trench-fill seam 137 during a STI etch 146, the protective layer being one of silicon dioxide, silicon nitride and silicon oxynitride. The silicon dioxide layer may be 5 nanometers to 20 nanometers thick, and may be formed by a thermal oxidation process. The silicon nitride layer may be 100 nanometers to 200 nanometers thick, and may be formed by an LPCVD process. Layers of other materials having a high CMP selectivity to silicon dioxide may be substituted for the silicon nitride layer of the CMP stop layer 140.

A field oxide mask 142 is formed over the CMP stop layer 140, to expose the CMP stop layer 140 in areas for a field oxide trench 144, in this example shown as a shallow trench known as shallow trench isolation (STI). The field oxide mask 142 may include photoresist and may be formed by a photolithographic process. Subsequently, semiconductor material 108 from the substrate 104 in areas where the substrate 104 is exposed to the STI etch 146 is removed by the STI etch 146 to form a field oxide trench 144 in the substrate 104. The field oxide trench 144 may extend to a depth of 250 nanometers to 1 micron in the semiconductor material 108, by way of example. It is advantageous for the trench-fill seam 137 to be covered by the CMP stop layer 140 during the STI etch 146 process. By covering the trench-fill seam 137 during the STI etch 146 process, the trench-fill seam 137 is protected from the STI etch 146 process which minimizes the trench-fill seam void volume 139 due to the attack of the STI etch 146 and subsequent trench etch clean processes on the trench-fill seam 137. Additionally, the deep trench sidewall dielectric layer 128 at the top surface 110 is covered by the CMP stop layer 140 to eliminate etching of the deep trench sidewall dielectric layer 128 at the top surface 110 during the STI etch 146 process.

The STI etch 146 may be implemented as a two-step process, in which a first etch step removes the CMP stop layer 140, and a second etch step removes the semiconductor material 108 and the electrically conductive trench-fill material 136 outside of the trench-fill seam 137 region. The first etch step may be implemented as a reactive ion etch (RIE) process using fluorine and oxygen, for example. The second etch step may be implemented as an RIE process using one or more halogens, for example.

A portion of the field oxide mask 142 may be removed by the STI etch 146. After the field oxide trench 144 is formed, any remaining portion of the field oxide mask 142 may be completely removed. Photoresist and other organic material in the field oxide mask 142 may be removed by an oxygen plasma process, followed by a series of wet etch processes, including an aqueous mixture of sulfuring acid and hydrogen peroxide, an aqueous mixture of ammonium hydroxide and hydrogen peroxide, and an aqueous mixture of hydrochloric acid and hydrogen peroxide.

Figure 1H:
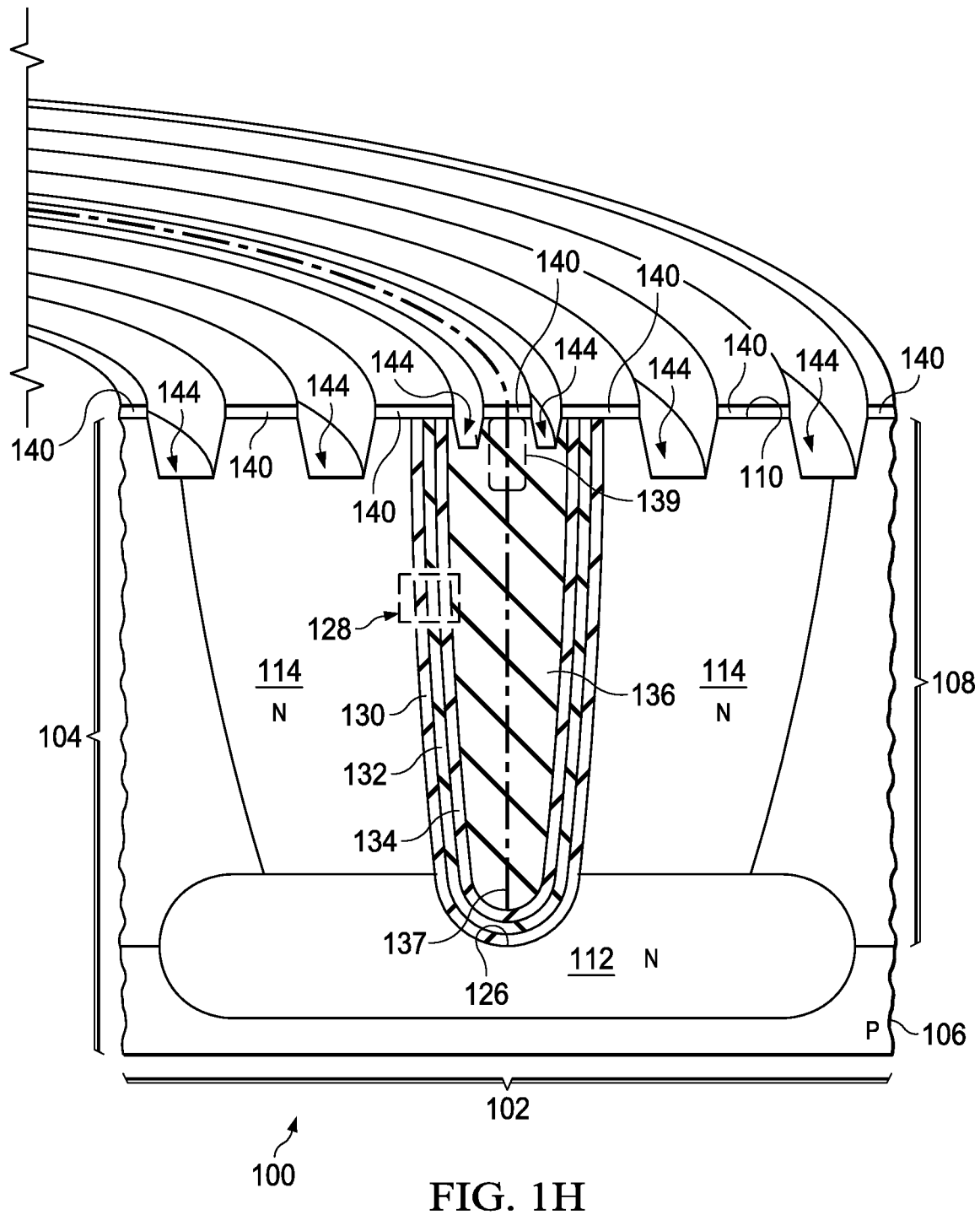
Figure 3A:
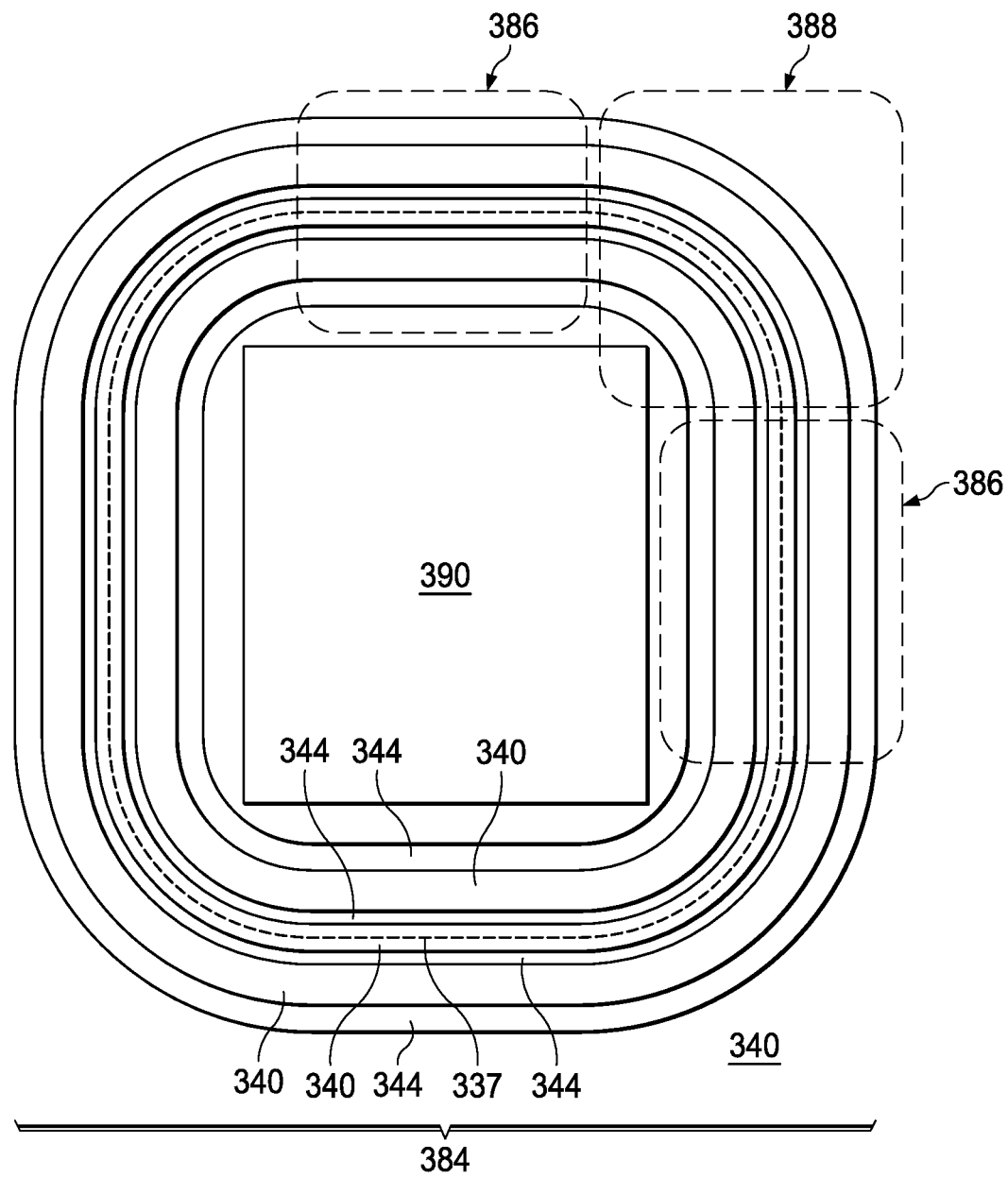
FIG. 3A discloses a top down view of a microelectronic device containing a continuous ring of integrated deep trench with a protective layer which is continuous covering the central seam of the electrically conductive trench-fill material in both the linear sections and corner sections.

FIG. 1H is a perspective view of microelectronic device 100 after the STI etch 146 and following the removal of the field oxide mask 142, showing the corner segment of a continuous deep trench ring of integrated trench 102 The CMP stop layer 140 of the ring structure is continuous over the integrated trench 102, both in the straight sections of the ring as well as the arcing sections at the corners. The CMP stop layer 140 provides protection for the trench-fill seam 137 during the STI etch 146 and the subsequent STI etch clean process. Covering the trench-fill seam 137 during the STI etch 146 and STI etch clean minimizes the trench-fill seam void volume 139. It is advantageous to minimize the trench-fill seam void 139 to minimize optical defects during subsequent yield enhancement inspections. The CMP stop layer 140 also covers the deep trench sidewall dielectric layer 128. The CMP stop layer 140 covering of the deep trench sidewall dielectric layer 128 protects the deep trench sidewall dielectric layer 128 from the STI etch 146 of FIG. 1G and subsequent STI etch clean. In one example, the deep trench 126 includes linear segments 384 and corner segments 386 forming a continuous deep trench ring 384 as illustrated in FIG. 3A.

Figure 1I:
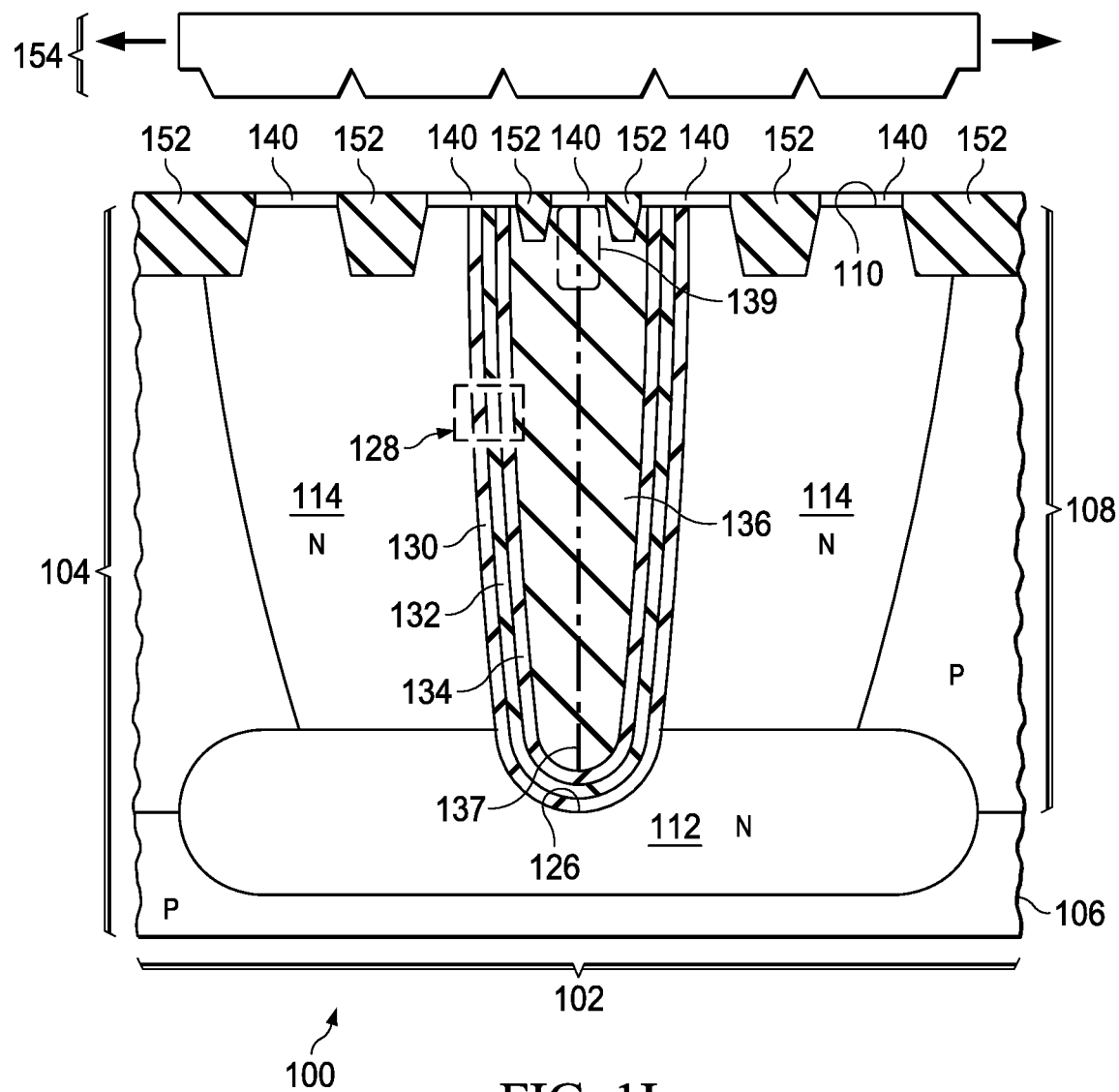

Referring to FIG. 1I, a field oxide layer 152 is formed in the field oxide trench 144 and over the CMP stop layer 140. The field oxide layer 152 is planarized so that the field oxide layer 152 does not extend over the top surface 110 of the substrate 104 and the integrated deep trench 102. The field oxide layer 152 may be planarized by a CMP process 154, as indicated in FIG. 1I. After the field oxide layer 152 is planarized, silicon nitride in the CMP stop layer 140 is removed. The silicon nitride may be removed by a wet etch process using an aqueous solution of phosphoric acid at 140° C. to 170° C. Silicon dioxide in the CMP stop layer 140 may optionally be removed, by a wet etch process using an aqueous solution of buffered hydrofluoric acid.

The CMP stop layer 140 may advantageously protect the trench-fill seam 137, and the deep trench sidewall dielectric layer 128 at the top surface 110. By covering the trench-fill seam 137 during the STI CMP and STI CMP clean process, the trench-fill seam void volume 139 is minimized. Additionally, the deep trench sidewall dielectric layer 128 at the top surface 110 is covered by the CMP stop layer 140 to eliminate CMP dishing and voiding of the deep trench sidewall dielectric layer 128 at the top surface 110 during the CMP process 154 and subsequent clean processes. The field oxide layer 152 may include primarily silicon dioxide, or silicon dioxide-based dielectric material, formed by one or more CVD processes alternated with etch-back processes to provide complete filling of the field oxide trench 144.

Figure 1J:
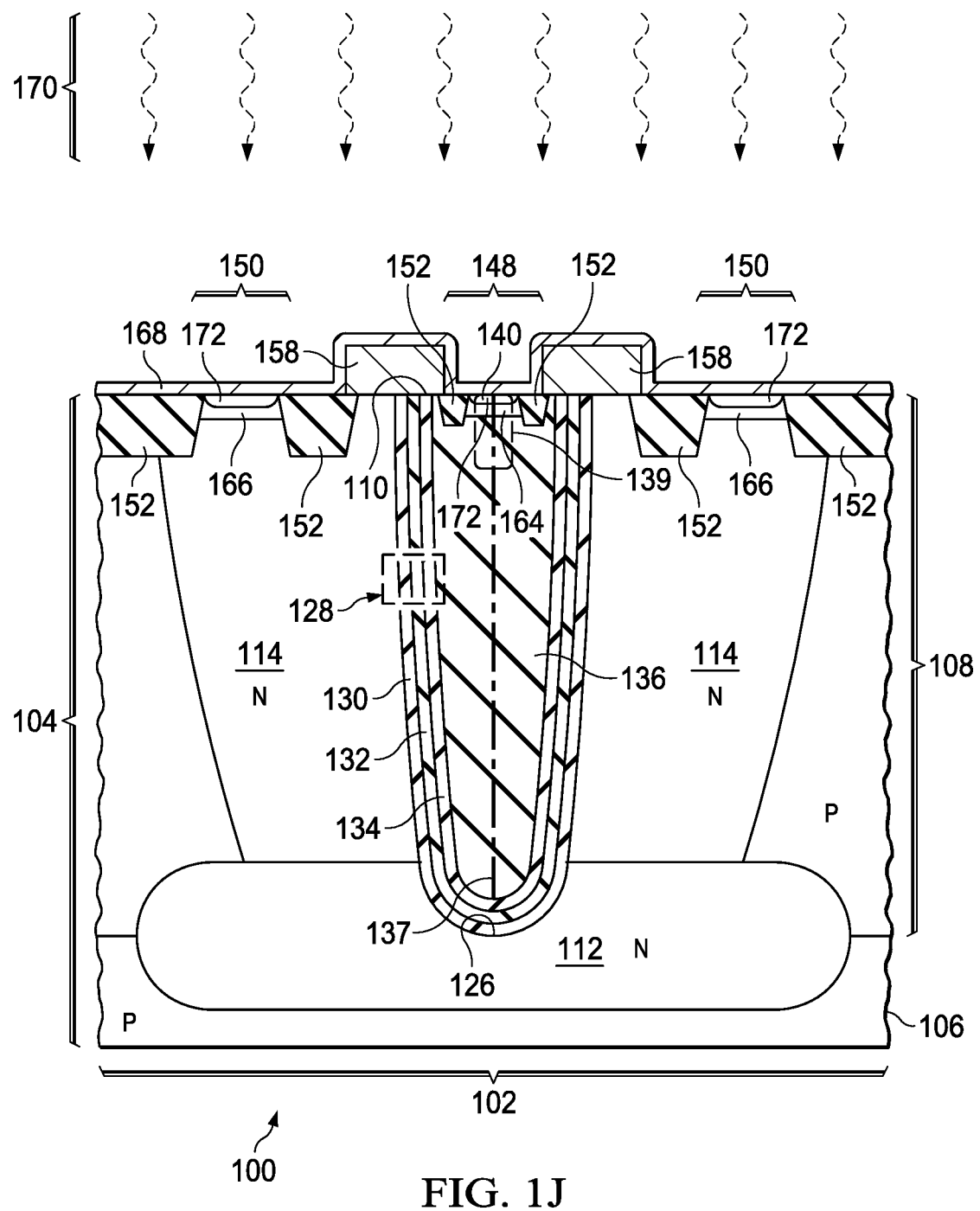

Referring to FIG. 1J, a silicide-blocking layer 158 is formed over the top surface 110 of the substrate 104. The silicide-blocking layer 158 may include one or more layers of silicon dioxide, silicon nitride, silicon oxynitride, or other dielectric material which is essentially unreactive with metals, such as titanium, cobalt, nickel, or platinum, that are used to form metal silicide. The silicide-blocking layer 158 may be formed by one or more LPCVD or PECVD processes. Silicon dioxide in the silicide-blocking layer 158 may be formed using TEOS. Silicon nitride in the silicide-blocking layer 158 may be formed using BTBAS. Silicon oxynitride in the silicide-blocking layer 158 may be formed using a combination of TEOS and BTBAS.

A silicide-blocking mask (not specifically shown) is formed over the silicide-blocking layer 158 covering the silicide-blocking layer 158 over the deep trench sidewall dielectric layer 128 at the top surface 110. A subsequent RIE etch process removes the silicide-blocking layer 158 in regions not covered by the silicide-blocking mask. The silicide block mask is removed by a similar process used to remove the field oxide mask 142 in FIG. 1G. After the formation of the silicide-blocking layer 158, a trench contact implant 164 and a substrate contact implant 166 are formed through a series of pattern and implant steps. The trench contact implant 164 may be formed by implanting a dopant of the first conductivity type, such as boron or gallium in this example, into the trench contact opening 148, followed by annealing the substrate 104 to activate the implanted first conductivity type dopants. The trench contact implant 164 may have average dopant concentrations above $10^{19}$ cm$^{-3}$, to provide low resistance connections to the electrically conductive trench-fill material 136.

A substrate contact implant 166 may be formed in the semiconductor material 108 in the substrate contact openings 150. The substrate contact implant 166 may be formed by implanting second conductivity type dopants, such as phosphorus, arsenic, or antimony in this example, into the semiconductor material 108 in the substrate contact openings 150, followed by annealing the substrate 104 to activate the implanted second conductivity type dopants. The substrate contact implant 166 may have average dopant concentrations above $10^{19}$ cm$^{-3}$, to provide low resistance connections to the semiconductor material 108 around the deep trench 126.

After the formation of the trench contact implant 164 and substrate contact implant 166, a metal layer 168 is formed over the substrate 104, contacting the electrically conductive trench-fill material 136 in the trench contact opening 148, and contacting the semiconductor material 108 in the substrate contact openings 150. The metal layer 168 may include titanium, cobalt, nickel, or platinum, or a combination thereof, by way of example. The metal layer 168 may be 10 nanometers to 100 nanometers thick, by way of example. The metal layer 168 is separated from the deep trench sidewall dielectric layer 128 at the top surface 110 by the silicide-blocking layer 158.

The metal layer 168 is heated by a radiant heating process 170, causing the metal layer 168 to react with the electrically conductive trench-fill material 136 in the trench contact opening 148 and the semiconductor material 108 of the substrate contact openings 150 and form a metal silicide layer 172 on the electrically conductive trench-fill material 136 of the trench contact openings 148, and on the semiconductor material 108 of the substrate contact openings 150. The silicide-blocking layer 158 does not react with the metal layer 168 to any significant degree, so that no significant amount of metal silicide is formed on the silicide-blocking layer 158, that is, no metal silicide remains on the silicide-blocking layer 158 after unreacted metal of the metal layer 168 is removed. The silicide-blocking layer 158 prevents metal silicide from being formed on the deep trench sidewall dielectric layer 128, at the top surface 110 of the semiconductor material 108.

After the metal silicide layer 172 is formed, the unreacted metal of the metal layer 168 is removed, leaving at least a portion of the metal silicide layer 172 in place. The unreacted metal of the metal layer 168 may be removed by a wet etch process using an aqueous mixture of nitric acid, hydrochloric acid, sulfuric acid or hydrofluoric acid, or a combination of these acids. After the unreacted metal of the metal layer 168 is removed, the silicide-blocking layer 158 is free of the metal silicide layer 172. The silicide-blocking layer 158 may subsequently be removed by a wet etch process or a plasma etch process.

Figure 1K:
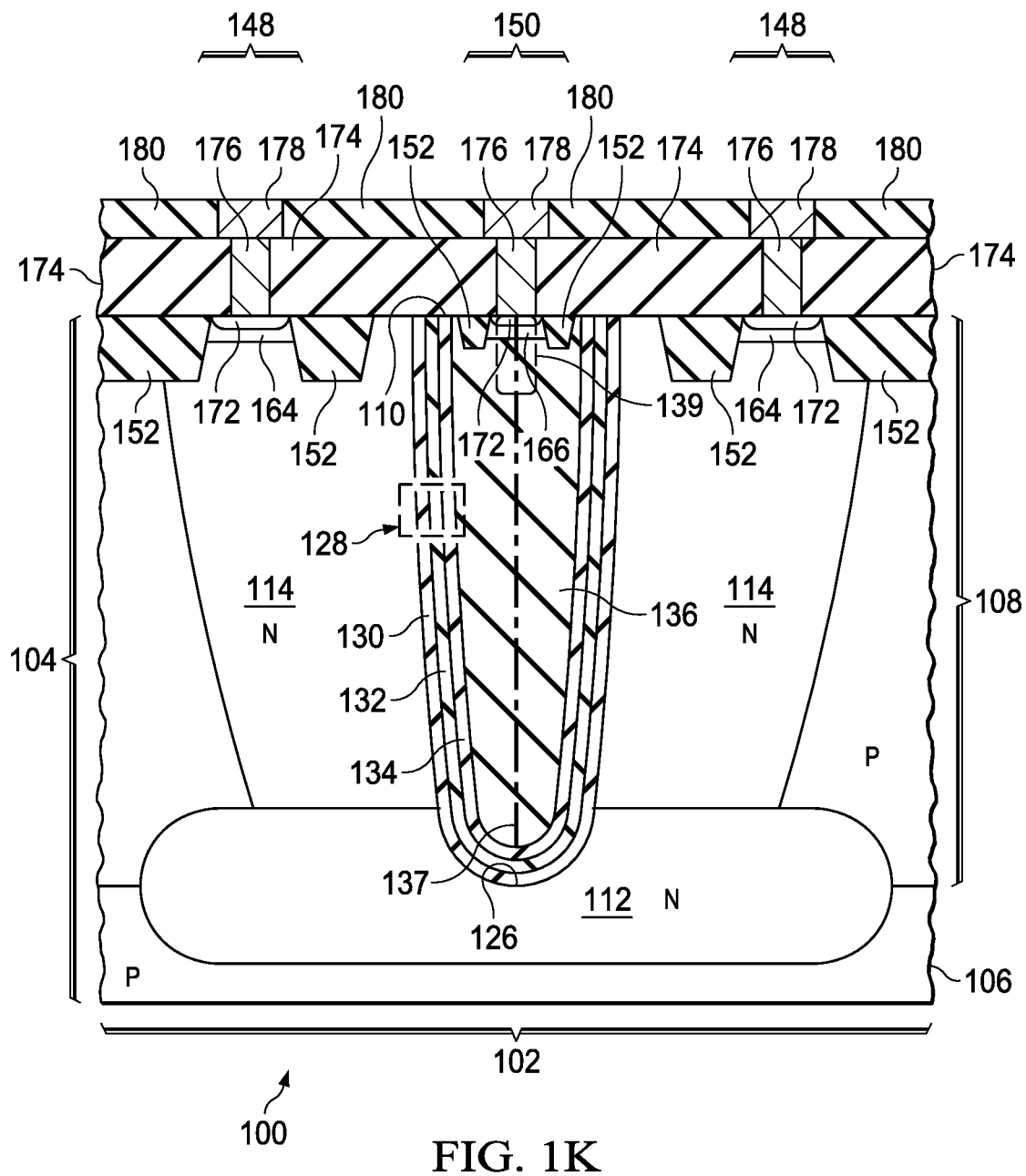

Referring to FIG. 1K, a pre-metal dielectric (PMD) layer 174 may be formed over the substrate 104 and the metal silicide layer 172. The PMD layer 174 may include one or more sublayers of dielectric material, such as a PMD liner of silicon nitride on the substrate 104 and the metal silicide layer 172, a main sublayer of silicon dioxide-based dielectric material on the PMD liner, and a PMD cap layer of silicon nitride or silicon carbide on the main sublayer. Other sublayer structures for the PMD layer 174 are within the scope of this example. The PMD layer 174 may be 300 nanometers to 2 microns thick, by way of example, and may be formed by one or more PECVD or CVD processes.

Contacts 176 may be formed through the PMD layer 174 to make electrical connections to the metal silicide layer 172. The contacts 176 may be formed by etching contact holes through the PMD layer 174 to expose the metal silicide layer 172, forming a contact liner containing titanium or tantalum in the contact holes, forming a contact liner of titanium nitride, and forming a contact fill metal containing tungsten on the contact liner, followed by removing the contact fill metal and the contact liner from the PMD layer 174 outside of the contact holes.

Interconnects 178 may be formed on the PMD layer 174 to make electrical connections to the contacts 176. The interconnects 178 may be formed by a damascene process: an intra-metal dielectric (IMD) layer 180 is formed on the PMD layer 174, and interconnect trenches are formed through the IMD layer 180, exposing the contacts 176. A trench liner metal containing tantalum or tantalum nitride is formed in the interconnect trenches, and a copper fill metal is formed on the trench liner metal by a combination of sputter and electroplating processes. The copper fill metal and the trench liner metal are removed from over the IMD layer 180 by a copper CMP process. Alternatively, interconnects 178 may include an aluminum alloy, and may be formed by forming sublayers of metal, including a main sublayer of aluminum with a few weight percent of silicon, copper or titanium, on the PMD layer 174, followed by masking and etching the sublayers of metal, to form etch aluminum interconnects 178. Other structures and methods of forming the interconnects 178 are within the scope of this example.

FIG. 2 discloses a cross sectional view of a microelectronic device 200 containing an integrated deep trench 202. The microelectronic device 200 shown in FIG. 2 is configured as a contact to the buried layer 212 instead of as a capacitor as shown in FIG. 1K. The substrate 204, base wafer 206, semiconductor material 208, top surface 210, buried layer 212 and deep well 214 are all formed in an analogous method as the substrate 104, base wafer 106, semiconductor material 108, top surface 110, buried layer 112 and deep well 114 discussed in FIG. 1A.

The deep trench 226 in the semiconductor material 208 is formed as discussed in FIG. 1B. The deep trench 226 extends from the top surface 210 of the substrate 204 into the semiconductor material 208. The deep trench 226 may extend to the buried layer 212 so that the buried layer 212 extends under the deep trench 226.

The deep trench sidewall dielectric layer 228 containing an outer layer 230, a center layer 232, and an inner layer 234 may be formed as discussed in FIG. 1D. After the formation of the deep trench sidewall dielectric layer 228, a deep trench dielectric etch process (not specifically shown) may be performed to improve thickness uniformity of the inner layer 234 and to form a deep trench substrate opening 282. The deep trench substrate opening 282 at the bottom of the deep trench 226 of the integrated deep trench 202 functions as an electrical conductivity pathway between the electrically conductive trench-fill material 236 and the buried layer 112 when the integrated deep trench 202 is used as a contact to the underlying buried layer 212 under the deep trench 226 or when the integrated deep trench 202 is used for isolating microelectronic components in the semiconductor material 208

The microelectronic device 200 shown FIG. 2 contains an electrically conductive trench-fill material 236 on the deep trench sidewall dielectric layer 228 and is formed as discussed in FIG. 1E. The electrically conductive trench-fill material 236 may contain a trench-fill seam 237. The trench-fill seam 237 may be a source of defectivity if the trench-fill seam 237 develops a trench-fill seam void volume 239 at the top surface 210 of the semiconductor material 208 during subsequent processing.

The microelectronic device 200 of FIG. 2 contains a field oxide 252 configured as shallow trench isolation (STI). During the etch which forms the STI trench process, the trench-fill seam 237 of the electrically conductive trench-fill material 136 is covered by a field oxide mask (not specifically shown) but similar to the field oxide mask 142 discussed in FIG. 1G during the STI etch 146. It is advantageous to cover the seam of the electrically conductive trench-fill material 236 during the STI etch 146 (shown in FIG. 1G) as covering the trench-fill seam 237 during the STI etch 146 process minimizes the trench-fill seam void volume 239 which can subsequently be a source of optical defectivity at in-line yield enhancement inspections after the STI etch 146.

A silicide-blocking layer 258 is formed similar to the silicide-blocking layer 158 in FIG. 1J (not specifically shown). The silicide-blocking layer 258 prevents silicide formation on the deep trench sidewall dielectric layer 228 at the top surface 210 of the semiconductor material 208. The silicide-blocking region 249 prevents formation of conductive material between the electrically conductive trench-fill material 236 and the semiconductor material 208 in the deep well 214.

A substrate contact implant 266, and a trench contact implant 264, may be formed in the in a series of pattern and etch steps as discussed in FIG. 1J. A metal silicide layer 272 is formed over the trench contact area 248 and the substrate contact area 250 as in FIG. 1I. After the formation of the metal silicide layer 272, a PMD layer 274, contacts 276, an IMD layer 280, and interconnects 278 are formed as discussed in FIG. 1J.

FIG. 3A discloses a top down view of a deep trench ring 384 at the same point in the process flow as FIG. 1H, the point in the flow after the field oxide trench 340 etch. The deep trench ring 384 is of the type used to isolate an electronic element from other electronic elements on an integrated circuit. In FIG. 3A, the deep trench seam 337 is covered by the CMP stop layer 340 both in the linear segments 386 and curved segments 388 of the deep trench ring 384 such that the CMP stop layer 340 is continuous around the deep trench ring 384 over the deep trench seam 337. By providing continuous coverage of the deep trench seam 337 by the CMP stop layer 340, the deep trench void 139 as shown and discussed in FIG. 1G is minimized. Minimizing the deep trench void 139 over the entire deep trench ring 384 minimizes observed defectivity during subsequent yield enhancement optical inspections. Other elements of FIG. 3A include STI trenches 344 and the isolated circuit 390.

Figure 3B:
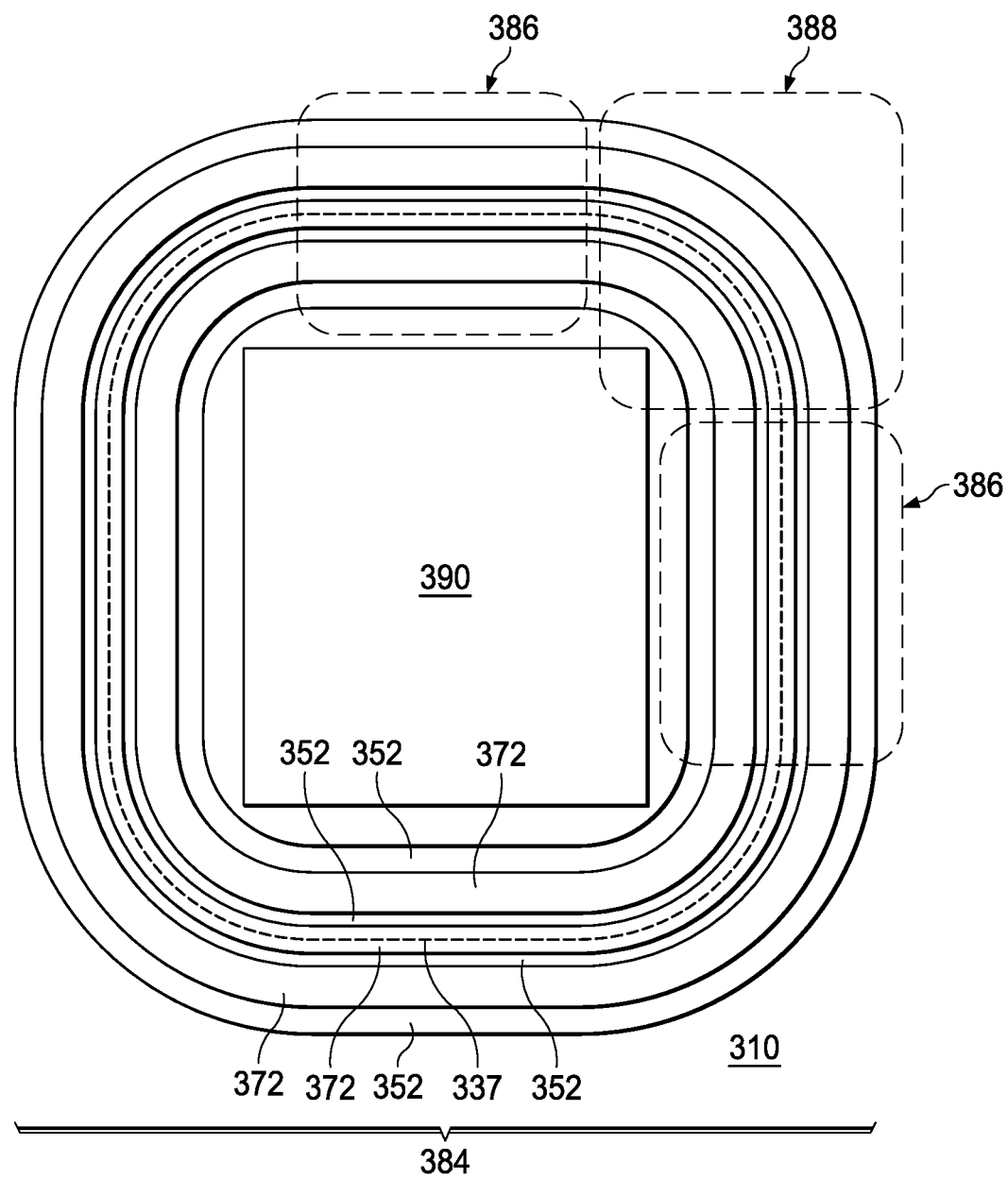
FIG. 3B discloses a top down view of a microelectronic device containing a continuous ring of integrated deep trench at the point in the process flow after the silicide has been formed.

Referring to FIG. 3B, a top down view of a deep trench ring 384 is shown after the metal silicide 372 has been formed and excess metal from the silicidation process has been removed. The deep trench ring 384 is typical of one where a deep trench is used to isolate an electronic element from other electronic elements on an integrated circuit. In FIG. 3A, the deep trench seam 337 is covered by the metal silicide 372 both in the linear segments 386 and curved segments 388 of the deep trench ring 384 such that the metal silicide 372 is continuous around the deep trench ring 384 over the deep trench seam 337. By providing continuous coverage of the deep trench seam 337 by the CMP stop layer 340, the deep trench void 139 as shown and discussed in FIG. 1G is minimized. Minimizing the deep trench void 139 at the earlier STI etch process over the entire deep trench ring 384 minimizes defectivity in the formation of the metal silicide 372 which may be observed during subsequent yield enhancement optical inspections. Other elements of FIG. 3B include field oxide 352, the isolated circuit 390, and the wafer surface 310.

Figure 3C:
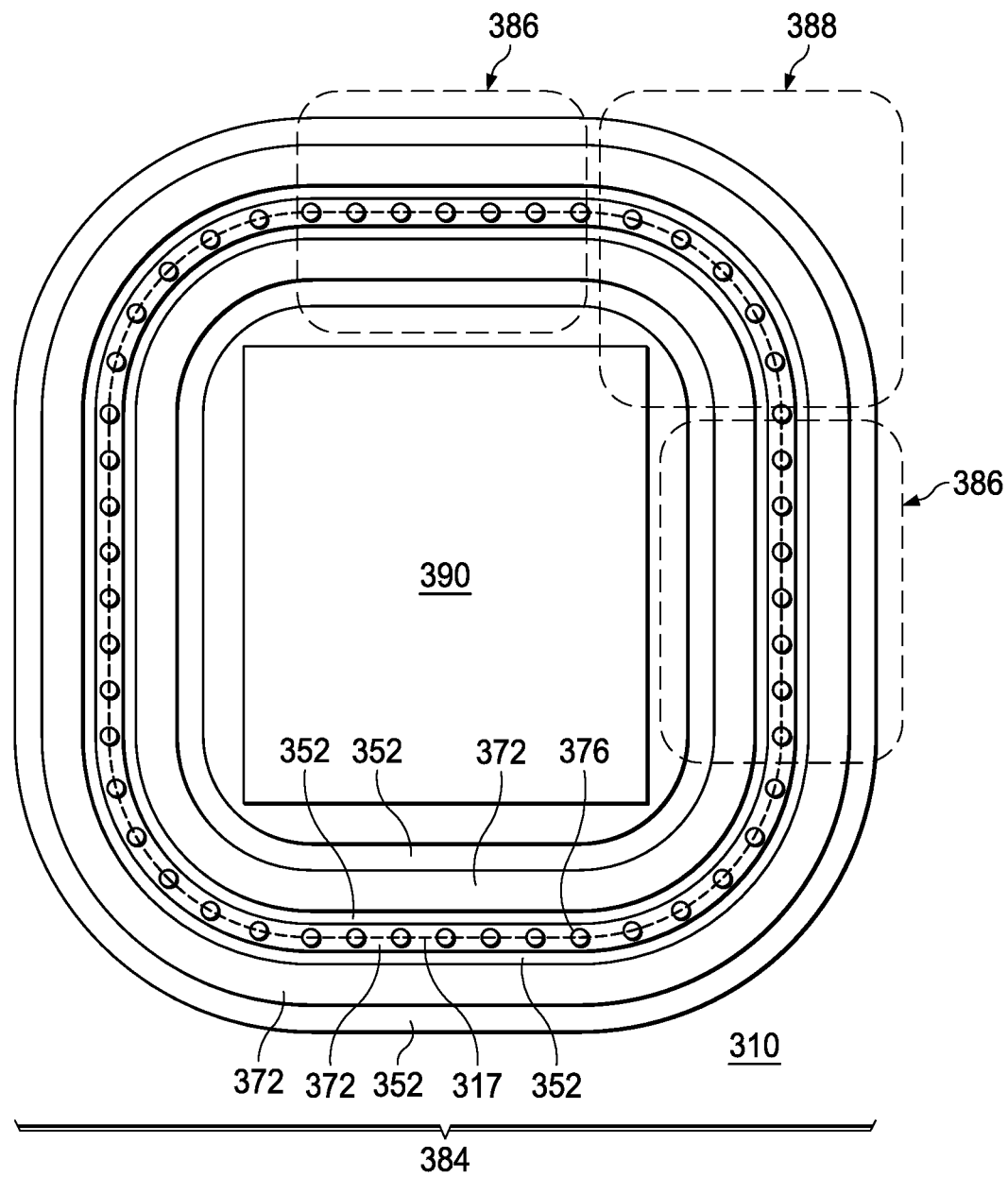
FIG. 3C discloses a top down view of a microelectronic device containing a continuous ring of integrated deep trench at the point in the process flow after the contacts have been formed.

Referring to FIG. 3C, a top down view of a deep trench ring 384 after the contacts 376 has been formed (the PMD 174 as shown in FIG. 1K is not shown for clarity). The deep trench ring 384 is typical of one where a deep trench is used to isolate an electronic element from other electronic elements on an integrated circuit. In FIG. 3C, the contacts 376 contact the metal silicide 372 over the deep trench seam 337 both in the linear segments 386 and curved segments 388 of the deep trench ring 384 such that the metal silicide 372 is continuous around the deep trench ring 384 over the deep trench seam 337. By providing continuous coverage of the deep trench seam 337 by the CMP stop layer 340, the deep trench void 139 as shown and discussed in FIG. 1G is minimized. Minimizing the deep trench void 139 at the earlier STI etch process over the entire deep trench ring 384 minimizes defectivity in the formation of the metal silicide 372 and the contacts 376 which may be observed during subsequent yield enhancement optical inspections. Other elements of FIG. 3B include field oxide 352, the isolated circuit 390, and the wafer surface 310.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A method, comprising:
    forming a deep trench in a semiconductor substrate, wherein the deep trench forms a continuous loop having linear sections and corner sections in the semiconductor substrate;
    forming a sidewall dielectric layer in the deep trench;
    filling the deep trench with a trench-fill material after forming the sidewall dielectric layer, the deep trench filled with the trench-fill material including a seam;
    forming a patterned protective layer over the semiconductor substrate, the patterned protective layer covering the seam;
    forming a shallow trench in the deep trench by removing the trench-fill material of the deep trench not covered by the patterned protective layer; and
    forming a shallow trench isolation structure in the deep trench by filling the shallow trench with an oxide layer.

2. The method of claim 1, further comprising:
    forming a metal silicide layer covering the seam.

3. The method of claim 1, wherein forming the sidewall dielectric layer includes:

forming an outer layer of silicon dioxide contacting the semiconductor substrate;

forming a center layer on the outer layer, the center layer including a dielectric material different than silicon dioxide; and forming an inner layer on the center layer, the inner layer including silicon dioxide.

4. The method of claim 1, wherein the sidewall dielectric layer includes silicon dioxide, silicon nitride, silicon oxynitride, or a combination thereof.

5. The method of claim 1, wherein the patterned protective layer covering the seam includes silicon nitride, silicon oxynitride, or silicon dioxide.

6. The method of claim 1, wherein the deep trench forms at least a part of a capacitor.

7. The method of claim 1, further comprising:
removing the trench-fill material outside of the deep trench prior to forming the patterned protective layer.

8. The method of claim 1, wherein the trench-fill material includes polycrystalline silicon.

9. The method of claim 1, further comprising:
forming a buried layer in the semiconductor substrate, the buried layer having an average dopant density greater than twice an average dopant density of the semiconductor substrate.

10. The method of claim 9, further comprising:
forming a deep well extending from a surface of the semiconductor substrate to the buried layer, wherein the deep well includes the deep trench.

11. The method of claim 1, further comprising:
forming a patterned silicide-blocking layer covering the sidewall dielectric layer in the deep trench, wherein the seam is uncovered by the patterned silicide-blocking layer.

12. The method of claim 11, further comprising:
implanting dopants in the seam that is uncovered by the patterned silicide-blocking layer.

13. The method of claim 1, wherein forming the shallow trench in the deep trench includes forming another shallow trench in the semiconductor substrate.

14. The method of claim 13, wherein forming the shallow trench isolation structure in the deep trench includes forming another shallow trench isolation structure in the semiconductor substrate.

15. A method, comprising:
forming a first trench in a semiconductor substrate, the first trench having a first depth from a surface of the semiconductor substrate;
forming a sidewall dielectric layer in the first trench;
filling the first trench with a conductive material after forming the sidewall dielectric layer, the conductive material including a seam after filling the first trench;
forming a patterned protective layer over the semiconductor substrate, the patterned protective layer covering the seam;

forming a second trench extended into the conductive material of the first trench, the first trench uncovered by the patterned protective layer and having a second depth from the surface of the semiconductor substrate less than the first depth;
filling the second trench with a dielectric material; and
forming a metal silicide layer covering the seam.

16. The method of claim 15, wherein the first trench forms a continuous loop having linear sections and corner sections in the semiconductor substrate.

17. The method of claim 15, wherein forming the sidewall dielectric layer includes:
forming a first layer of a first dielectric material contacting the semiconductor substrate;
forming a second layer of a second dielectric material, the second dielectric material different than the first dielectric material; and
forming a third layer on the second layer, the third layer including the first dielectric material.

18. The method of claim 15, wherein the sidewall dielectric layer includes silicon dioxide, silicon nitride, silicon oxynitride, or a combination thereof.

19. The method of claim 15, wherein the patterned protective layer covering the seam includes silicon nitride, silicon oxynitride, or silicon dioxide.

20. The method of claim 15, wherein the first trench forms at least a part of a capacitor.

21. The method of claim 15, further comprising:
removing the conductive material outside of the first trench prior to forming the patterned protective layer.

22. The method of claim 15, wherein the conductive material includes polycrystalline silicon.

23. The method of claim 15, wherein forming the second trench includes forming a third trench in the semiconductor substrate.

24. The method of claim 15, further comprising:
forming a buried layer in the semiconductor substrate, the buried layer having an average dopant density greater than an average dopant density of the semiconductor substrate.

25. The method of claim 24, further comprising:
forming a well extending from the surface of the semiconductor substrate to the buried layer, wherein the well includes the first trench.

26. The method of claim 15, further comprising:
forming a patterned dielectric layer covering the sidewall dielectric layer in the first trench, wherein the seam is uncovered by the patterned dielectric layer.

27. The method of claim 26, further comprising:
implanting dopants in the seam that is uncovered by the patterned dielectric layer.

* * * * *